United States Patent
Hagen

(10) Patent No.: US 6,938,172 B2
(45) Date of Patent: Aug. 30, 2005

(54) DATA TRANSFORMATION FOR THE REDUCTION OF POWER AND NOISE IN CMOS STRUCTURES

(75) Inventor: Michael S. Hagen, Vancouver, WA (US)

(73) Assignee: Tektronix, Inc., Beaverton, OR (US)

( * ) Notice: Subject to any disclaimer, the term of this patent is extended or adjusted under 35 U.S.C. 154(b) by 684 days.

(21) Appl. No.: 10/054,557

(22) Filed: Jan. 18, 2002

(65) Prior Publication Data

US 2002/0163359 A1 Nov. 7, 2002

Related U.S. Application Data

(60) Provisional application No. 60/277,587, filed on Mar. 21, 2001.

(51) Int. Cl.⁷ ................................................. G06F 1/32
(52) U.S. Cl. ....................... 713/300; 713/320; 708/100; 708/400; 708/671; 375/312
(58) Field of Search ............................... 713/300, 320; 708/100, 400, 671; 375/312

(56) References Cited

U.S. PATENT DOCUMENTS

| | | | | |
|---|---|---|---|---|
| 5,719,843 A | * | 2/1998 | Nakajima et al. | 369/59.22 |
| 6,141,761 A | * | 10/2000 | Chang et al. | 713/300 |
| 6,721,254 B1 | * | 4/2004 | Yamaguchi | 369/53.35 |

FOREIGN PATENT DOCUMENTS

EP                0398690 A2 * 11/1990 ........... H03M/13/12

* cited by examiner

Primary Examiner—Rehana Perveen
(74) Attorney, Agent, or Firm—Thomas F. Lenihan

(57) ABSTRACT

A data transformation algorithm is selectively applied to each data vector as it enters the pipelined structure. In a selection step, the algorithm compares the bit value of the new data vector with the corresponding bit values of the preceding data vector, and sums the number of logic transitions. The transformation algorithm is applied to the new data vector only if it would reduce the resulting number of transitions, otherwise the data vector is propagated unmodified. Bit inversion is a data transformation algorithm according to the present invention that provides up to a 50% reduction in the number of logic transitions.

16 Claims, 4 Drawing Sheets

| Change (Decimal) | Previous State (Binary) | New State (Binary) | Logic Transitions | Change (Decimal) | Previous State (Binary) | New State (Binary) | Logic Transitions |
|---|---|---|---|---|---|---|---|
| 0 to 1 | 000 | 001 | 1 | 1 to 0 | 001 | 000 | 1 |
| 0 to 2 | 000 | 010 | 1 | 2 to 0 | 010 | 000 | 1 |
| 0 to 3 | 000 | 011 | 2 | 3 to 0 | 011 | 000 | 2 |
| 0 to 4 | 000 | 100 | 1 | 4 to 0 | 100 | 000 | 1 |
| 0 to 5 | 000 | 101 | 2 | 5 to 0 | 101 | 000 | 2 |
| 0 to 6 | 000 | 110 | 2 | 6 to 0 | 110 | 000 | 2 |
| 0 to 7 | 000 | 111 | 3 | 7 to 0 | 111 | 000 | 3 |
| 1 to 2 | 001 | 010 | 2 | 2 to 1 | 010 | 001 | 2 |
| 1 to 3 | 001 | 011 | 1 | 3 to 1 | 011 | 001 | 1 |
| 1 to 4 | 001 | 100 | 2 | 4 to 1 | 100 | 001 | 2 |
| 1 to 5 | 001 | 101 | 1 | 5 to 1 | 101 | 001 | 1 |
| 1 to 6 | 001 | 110 | 3 | 6 to 1 | 110 | 001 | 3 |
| 1 to 7 | 001 | 111 | 2 | 7 to 1 | 111 | 001 | 2 |
| 2 to 3 | 010 | 011 | 1 | 3 to 2 | 011 | 010 | 1 |
| 2 to 4 | 010 | 100 | 2 | 4 to 2 | 100 | 010 | 2 |
| 2 to 5 | 010 | 101 | 3 | 5 to 2 | 101 | 010 | 3 |
| 2 to 6 | 010 | 110 | 1 | 6 to 2 | 110 | 010 | 1 |
| 2 to 7 | 010 | 111 | 2 | 7 to 2 | 111 | 010 | 2 |
| 3 to 4 | 011 | 100 | 3 | 4 to 3 | 100 | 011 | 3 |
| 3 to 5 | 011 | 101 | 2 | 5 to 3 | 101 | 011 | 2 |
| 3 to 6 | 011 | 110 | 2 | 6 to 3 | 110 | 011 | 2 |
| 3 to 7 | 011 | 111 | 1 | 7 to 3 | 111 | 011 | 1 |
| 4 to 5 | 100 | 101 | 1 | 5 to 4 | 101 | 100 | 1 |
| 4 to 6 | 100 | 110 | 1 | 6 to 4 | 110 | 100 | 1 |
| 4 to 7 | 100 | 111 | 2 | 7 to 4 | 111 | 100 | 2 |
| 5 to 6 | 101 | 110 | 2 | 6 to 5 | 110 | 101 | 2 |
| 5 to 7 | 101 | 111 | 1 | 7 to 5 | 111 | 101 | 1 |
| 6 to 7 | 110 | 111 | 1 | 7 to 6 | 111 | 110 | 1 |
| | | | | | | | |
| 0 to 0 | 000 | 000 | 0 | | | | |
| 1 to 1 | 001 | 001 | 0 | | | | |
| 2 to 2 | 010 | 010 | 0 | | | | |
| 3 to 3 | 011 | 011 | 0 | | | | |
| 4 to 4 | 100 | 100 | 0 | | | | |
| 5 to 5 | 101 | 101 | 0 | | | | |
| 6 to 6 | 110 | 110 | 0 | | | | |
| 7 to 7 | 111 | 111 | 0 | | | | |

Fig. 1

| Decimal Value | Binary Encoding | Logic Transitions | Inversion | Transformed Data | Logic Transitions |
|---|---|---|---|---|---|
| 0 | 000 | - | No | 000 | - |
| 1 | 001 | 1 | No | 001 | 1 |
| 2 | 010 | 2 | Yes | 101 | 1 |
| 3 | 011 | 1 | Yes | 100 | 1 |
| 4 | 100 | 3 | No | 100 | 0 |
| 5 | 101 | 1 | No | 101 | 1 |
| 6 | 110 | 2 | Yes | 001 | 1 |
| 7 | 111 | 1 | Yes | 000 | 1 |
| 0 | 000 | 3 | No | 000 | 0 |
| 3 | 011 | 2 | Yes | 100 | 1 |
| 2 | 010 | 1 | Yes | 101 | 1 |
| 7 | 111 | 2 | No | 111 | 1 |
| 4 | 100 | 2 | Yes | 011 | 1 |
| 1 | 001 | 2 | No | 001 | 1 |

Fig. 4

DATA TRANSFORMATION FOR THE REDUCTION OF POWER AND NOISE IN CMOS STRUCTURES

CLAIM FOR PRIORITY

The subject patent application hereby claims priority from U.S. Provisional Patent Application Ser. No. 60/277,587 (Hagen), filed 21 Mar. 2001.

BACKGROUND OF THE INVENTION

In large CMOS logic structures, the primary source of power dissipation and noise results from the transition of logic levels throughout the structure. This power dissipation and noise can be a significant limiting factor in the implementation of large CMOS logic structures. It is noted that in CMOS circuitry, power dissipation is directly proportional to the number of bit transitions propagating through the structure.

What is needed is a way to reduce the number of logic transitions that occur in a pipelined structure while preserving the information in the data.

SUMMARY OF THE INVENTION

A data transformation algorithm is selectively applied to each data vector as it enters the pipelined structure. In a selection step, the algorithm compares the bit value of the new data vector with the corresponding bit values of the preceding data vector, and sums the number of logic transitions. The transformation algorithm is applied to the new data vector only if it would reduce the resulting number of transitions, otherwise the data vector is propagated unmodified.

Bit inversion is a data transformation algorithm according to the present invention that provides a reduction in the number of logic transitions of up to 50%.

BRIEF DESCRIPTION OF THE DRAWING

FIG. 1 shows a table useful for understanding the subject invention.

FIG. 4 shows a table useful for understanding the subject invention.

DETAILED DESCRIPTION OF THE EMBODIMENT

Figure 2:
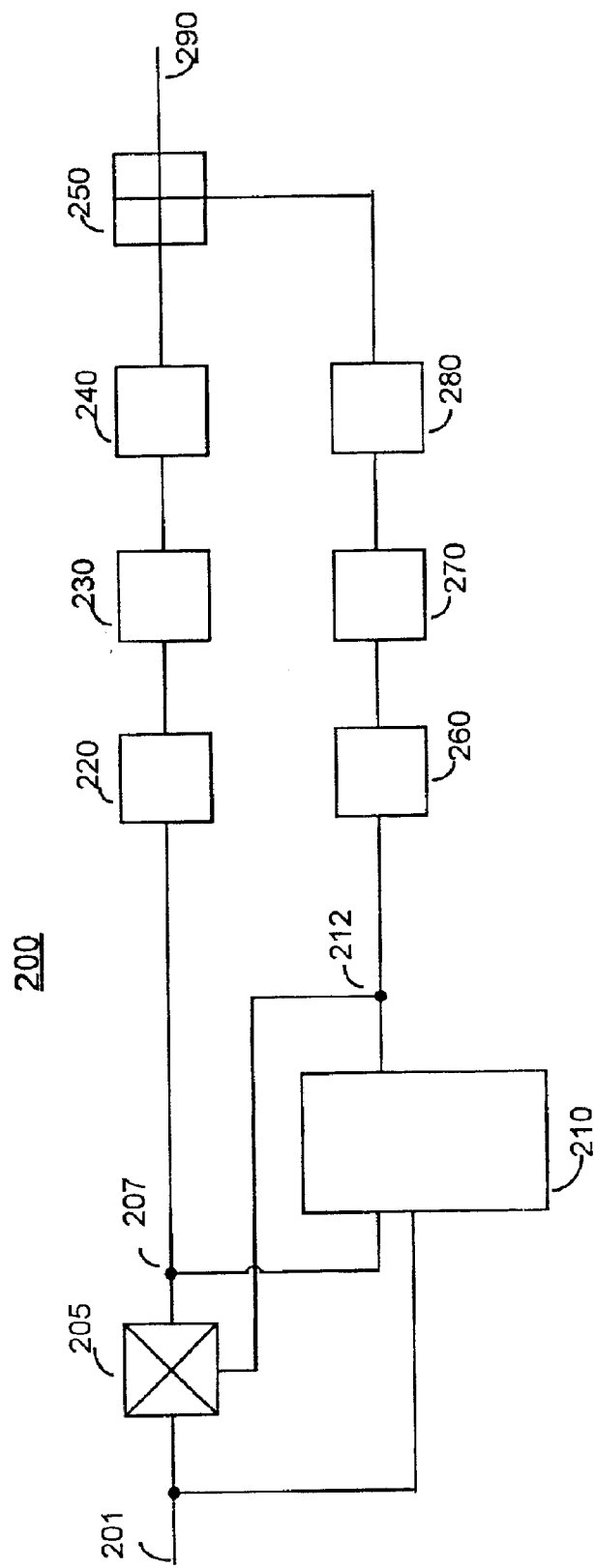
FIG. 2 shows a pipelined logic transformation structure, in block diagram form, according to the subject invention.

CMOS (Complementary Metal-Oxide Semiconductor) technologies provide the capability to design very large digital structures. The main contributor to power dissipation in CMOS circuits is the transition of logic states within the logic gates. The power dissipated in this way is proportional to the number of gates that produce a logic transition per unit time. At high clock rates, this dynamic power dissipation can be the limiting factor for large CMOS designs.

One method for reducing the dynamic power dissipation in CMOS components is to employ architectures that reduce the number of logic transitions in the implementation of a desired function. An example of this approach is the use of gray code instead of binary code for sequential address generators. Gray code produces only a single logic transition for each sequential change of state, whereas, on average, binary code will produce one-half as many logic transitions as there are bits in the code.

Statistically, for an N-bit code, one can express the total number of states wherein at least one bit changes from a previous state as $2(_2C_2^N)$ possible outcomes. That is, the parenthetical expression $(_2C_2^N)$ defines the total number of unique combinations of two sequential data words from an entire set of data words. The multiplier of 2 accounts for a positive going changes and negative going changes (i.e., a value of 7 falling to a value of 4, and a value of 4 rising to a value of 7 should both be counted). For a 3 bit code, N=3 and $$2(_2C_2^3) = 2\frac{8!}{2\times 6!} = \frac{8\times 7\times 6!}{6!} = 56$$

possible outcomes having a bit transition.

All possible transitions from one 3-bit value to another 3-bit value are shown in FIG. 1. There are fifty-six possible transitions in which at least one bit will change from the previous state to the new state, and eight possible "transitions" in which no bit changes at all, for a total of sixty-four possible outcomes. If one were to add all of the logic transitions (total number of bits that change) in these sixty-four possible outcomes, the result would be ninety-six bit-changes. The average of ninety-six bit-changes over 64 possible outcomes is 1.5. In accordance with the relationship given above, in a binary code having only 3 bits the average number of transitions equals 1.5, or one-half the number of bits in the code.

It is herein recognized that use of an architecture that reduces the number of logic transitions for a given function can dramatically reduce the power consumed in CMOS circuits.

The goal of the approach of the subject invention is to reduce the number of logic transitions produced in a pipelined logic structure. As a sequence of new data vectors is presented to such a structure, each new vector will produce a number of logic transitions. The number of logic transitions depends upon the prior state of the inputs. Once the data enters the pipeline, these transitions repeat on each clock edge until the data exits the structure. For many pipeline structures, the data is directly operated on in relatively few pipeline locations when one considers the depth of the pipeline.

In these cases, a power-saving advantage can be gained by transforming the data vector into a new value which will generate fewer logic transitions as it propagates through the pipeline. At locations where the data must be operated on, the inverse transformation is performed, thus regenerating the original data vector. By this method, the total number of logic transitions is reduced in the pipeline structure.

FIG. 2 shows an example of a pipelined logic transformation structure in accordance with the subject invention. Data vectors enter the structure at point 201, and a data vector that is one sample older in time exists at point 207. These two vector are presented to controller 210 which determines the transformation algorithm to be employed, and produces a resulting transformation vector at point 212. This transformation vector is coupled to a sampler unit 205 and applied to the incoming data vector at point 201 when it is sampled by sampler unit 205. The newly transformed data vector at point 207 and the transformation vector at point 212 are propagated in parallel through the pipeline structure 220, 230, 240 and 260, 270, 280. For simplicity and ease of explanation, pipeline structure 220, 230, 240 and 260, 270, 280 represented as a series of latches.

One skilled in the art will realize that each stage of pipeline structure 220, 230, 240 and 260, 270, 280 may be a stage in which some data processing may occur. In this regard, assume that the original data vector is to be operated on by a stage (not shown) following point 290. In such a case the data vector may need to be restored to its original form before such processing occurs. Restoring the data vector to its original form is accomplished in a data transformation unit 250 by performing a reverse transformation.

The following facts should be considered when evaluating whether to implement the logic transformation arrangement of the subject invention. To implement such a logic transformation arrangement, additional logic circuitry must be provided. The transformation vector must be propagated in parallel with the vector data, thus increasing the pipeline width. Propagating the transformation vector through the pipeline increases the number of logic transitions that occur. Reverse transformation circuitry must be provided to recover the data in its original form. The approach works best when the transformation and reverse transformation algorithms are easy to implement, the transformation vector is simple (i.e., has few bits) and the actual data (i.e., the data in its original form) is needed at only a few points in the pipeline.

Figure 3:
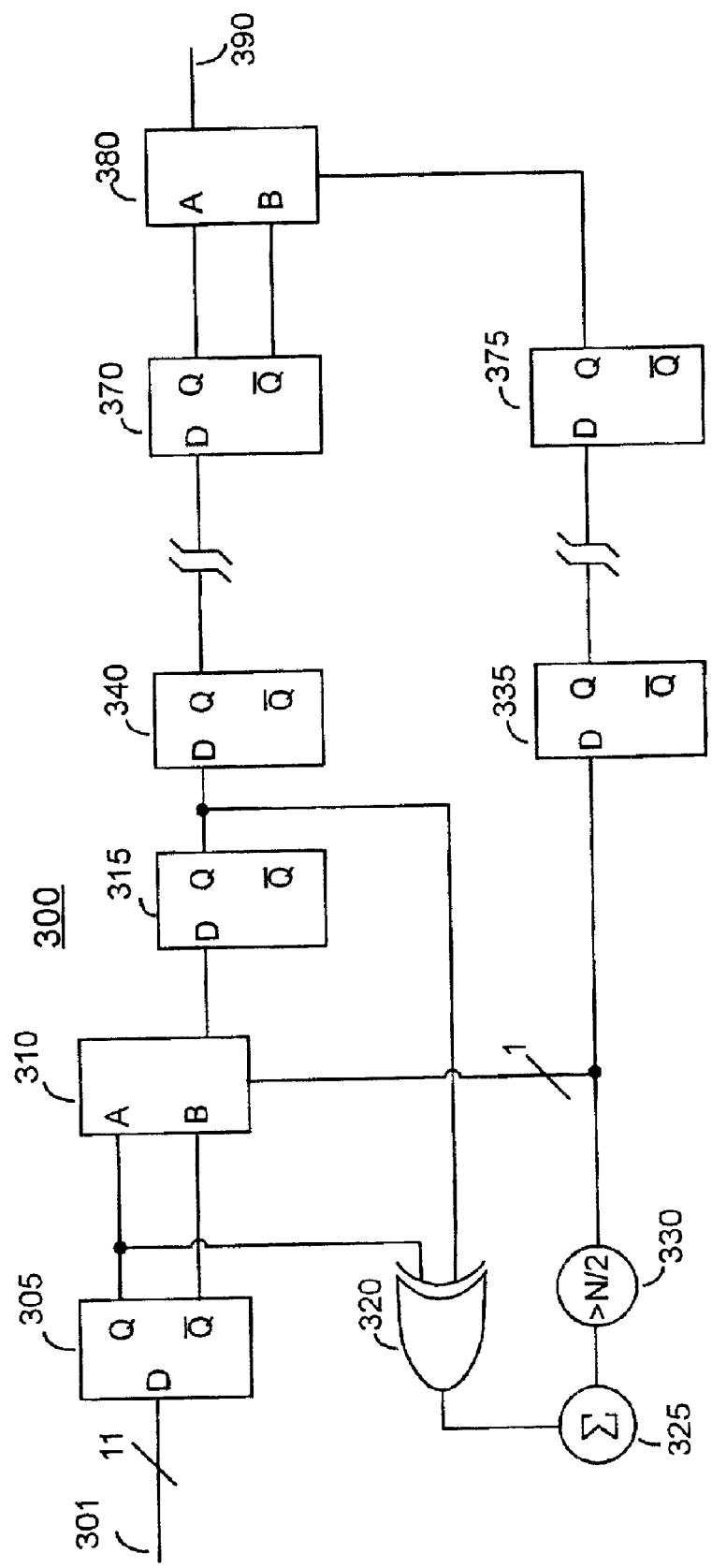
FIG. 3 shows apparatus, in block diagram form, useful for implementing the subject invention.

A more detailed view of an embodiment of the invention is shown in FIG. 3. In this example the selected data stream width is 11 bits. This width was selected based on tradeoffs between three parameters of the circuit. A wider data vector produces logic transitions closer to the theoretical limit of 50%, wider data vectors increase the complexity and delay of the summation circuitry, and an odd number of bits in the data vector produces a symmetry which improves the efficiency of the transformation algorithm.

In this embodiment, the transformation algorithm employed is vector inversion. As 11-bit data enters the circuitry 300 at an input point 301, a determination is made of how many bits will change (i.e., number of logic transitions) from the previous sample. This is accomplished by performing an exclusive-OR (XOR) function on each bit position of the new data vector and its counterpart bit position in the preceding data vector. Data from the Q output of latch 305 (the new data vector) is applied to one input of an XOR-gate 320. Data from the Q output of latch 315 is applied to the other input of XOR-gate 315. In accordance with the normal rules for the operation of an XOR function, a "logical true" output signal will be produced only when the two inputs are in opposite states. Thus, each "logical true" signal represents one bit transition. The output of XOR gate 320 is applied to a summer unit 325. Summer unit 325 adds all of the "logical true" signals that it receives and applies the sum to a controller 330.

Controller 330 determines if the sum of the transitions exceeds one-half of the number of bits in the code. In this case, 11 divided by 2 yields 5.5 transitions. Therefore, 6 transitions, or more, will cause controller 330 to initiate a data transformation to reduce the number of transitions in the data vector. In operation controller 330, produces a logic level signal of the proper polarity to cause a 2-to-1 multiplexor (MUX) 310 to select the data at input A if it is determined that no data inversion is required, or to select the data at input B if it is determined that a data inversion is required. Note that the data at the Q output (non-inverting output) of latch 305 is applied to input A of MUX 310, and the data at the Q-BAR output (inverting output) of latch 305 is applied to input B of MUX 310. Thus, the selected data output signal of MUX 310 will be latched into latch 315 and propagated through pipeline elements 340, 370. The transformation vector from controller 330 will be propagated through pipeline elements 335, 375 in parallel with its corresponding data vector. A reverse transformation is preformed in a 2-to-1 MUX 380 under control of a selection signal generated by latch 375. As can be readily seen, this selection signal is the transformation vector corresponding to that particular data vector.

To evaluate the benefits of the transformation algorithm, we first calculate the performance of the circuit without transformation. When random data is applied to the circuit, it can be shown that the average number of logic transformations produced by each vector is 5.5 (one-half of 11 as noted above). The worst case state changes produce 11 bit transitions (00000000000→11111111111 and 11111111111→00000000000). When inversion is applied, the worst case patterns are transformed respectively to and 00000000000→00000000000 and 11111111111→11111111111, producing no transitions at all. The one-bit transformation vector changes also from 0→1 indicating inversion of the entire 11-bit data vector.

This produces new worst case conditions exemplified by, 00000000000→00000111111, that is 6 of the 11 bits changing. In these cases, inversion will result in 5 bits changing 00000000000→11111000000, and also the changing of the transition vector bit. Thus, the worst case number of bit transitions has been reduced from 11 to 6, a 45.5% reduction.

To determine the average number of logic transitions for random data, a simulation program was written that tested each possible state transition of an 11 bit number. The algorithm described above was then applied and the results observed. The average number of logic transitions per 11-bit data vector without transformation is 5.5, and the average number of logic transitions after transformation is 4.4 for a 21% reduction in the number of logic transitions.

FIG. 4 is a table of three-bit data vectors showing the number of logic transitions caused by the presentation of subsequent data, whether inversion is warranted, and the number of logic transitions after data inversion. In this example 13 data vectors are propagated through the pipeline (excluding the original state of 000). The average number of transitions for a this particular set of binary coded data is 1.77 logic transformations per vector. The average number of transitions for a three-bit code is 1.5. The average number of transformations fort the transformed data is 1.46 logic transitions per vector for a 17.5% reduction. As the number of bits in the data vector increases, the inclusion of the one-bit translation vector becomes less significant. It is noted that a 50% reduction in transitions is the theoretical limit.

While an odd number of bits in the data vector is preferred, the circuitry of the invention will also work for data vectors having an even number of bits if the control algorithm is modified accordingly. Once such modification is to invert when the number of transitions is equal to, or greater than, (N/2)+1. Thus a 12 bit code would invert when the number of logic transitions is equal to, or greater than 7.

While the invention has been described in the environment of CMOS circuitry, it is applicable in any technology in which power dissipation is proportional to number of bit transitions.

It is herein recognized that controller 330 of FIG. 3 may be a digital comparator circuit, or may be a function performed by a microprocessor.

What is claimed is:

1. Circuitry for reducing power dissipation in a integrated circuit, comprising:
   a data latch for storing a first multibit digital signal;
   an input data latch for receiving a second multibit digital signal, said input data latch producing transformed and untransformed versions of said second multibit digital signal;

a comparing circuit for comparing values of bits in respective bit positions of said first and second multibit digital signals and producing an output signal representative of a state transition at each bit position;

summing circuitry coupled to said comparing circuitry for providing a sum of state transitions for each comparison of said multibit digital signals;

a controller for determining if said sum exceeds a predetermined value, and producing a transformation vector signal in response thereto;

a selection circuit coupled to said input data latch for selecting one of said transformed and said untransformed versions of said second multibit digital signal in response to said transformation vector signal.

2. The circuitry of claim 1 wherein said comparing circuit is an exclusive-OR gate.

3. The circuitry of claim 2 wherein said controller performs a digital value comparison based on the values of the sum and a value representative of predetermined value.

4. The circuitry of claim 3 wherein said predetermined value is one-half the number of bits of said multibit data signal.

5. The circuitry of claim 4 wherein said transformed version of said second multibit digital signal is generated by inverting all bits of said second multibit digital signal in response to said transformation vector signal.

6. The circuitry of claim 5 wherein said selection circuitry is a first 2-to-1 multiplexor for selecting between said transformed and said untransformed versions of said second multibit digital signal.

7. The circuitry of claim 6 further including:

circuitry for conveying said transformation vector signal in parallel with said multibit digital signal; and reverse transformation circuitry for restoring said transformed version of said second multibit digital signal to its original form in response in response to said transformation vector signal.

8. The circuitry of claim 7 wherein said reverse transformation circuitry is a second 2-to-1 multiplexor for selecting between inverted and non-inverted versions of said second multibit digital signal in response to said transformation vector signal.

9. A method for reducing power dissipation in a integrated circuit, comprising the steps of:

storing a first multibit digital signal;

receiving a second multibit digital signal;

producing transformed and untransformed versions of said second multibit digital signal;

comparing values of bits in respective bit positions of said first and second multibit digital signals and producing an output signal representative of a state transition at each bit position;

providing a sum of state transitions for each comparison of said multibit digital signals;

determining if said sum exceeds a predetermined value, and producing a transformation vector signal in response thereto;

selecting one of said transformed and said untransformed versions of said second multibit digital signal in response to said transformation vector signal.

10. The method of claim 9 wherein said comparing step employs an exclusive-OR function.

11. The method of claim 10 wherein said determining step is a digital value comparison based on the values of the sum and a value representative of predetermined value.

12. The method of claim 11 wherein said predetermined value is one-half the number of bits of said multibit data signal.

13. The method of claim 12 wherein said transformed version of said second multibit digital signal is generated by inverting all bits of said second multibit digital signal in response to said transformation vector signal.

14. The method of claim 13 wherein said selection step employs a first 2-to-1 multiplexor for selecting between said transformed and said untransformed versions of said second multibit digital signal.

15. The method of claim 14 further including the steps of:

conveying said transformation vector signal in parallel with said multibit digital signal; and restoring said transformed version of said second multibit digital signal to its original form in response in response to said transformation vector signal.

16. The method of claim 15 wherein said reverse transformation employs a second 2-to-1 multiplexor for selecting between inverted and non-inverted versions of said second multibit digital signal in response to said transformation vector signal.

* * * * *